US008178396B2

(12) United States Patent
Sinha et al.

(10) Patent No.: US 8,178,396 B2
(45) Date of Patent: May 15, 2012

(54) METHODS FOR FORMING THREE-DIMENSIONAL MEMORY DEVICES, AND RELATED STRUCTURES (75) Inventors: Nishant Sinha, Boise, ID (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 413 days.

(21) Appl. No.: 12/402,103

(22) Filed: Mar. 11, 2009

(65) Prior Publication Data
US 2010/0230724 A1 Sep. 16, 2010

(51) Int. Cl.
H01L 21/82 (2006.01)
(52) U.S. Cl. .......... 438/128; 257/E29.001; 257/E21.001
(58) Field of Classification Search ............. 438/128; 257/E21.001, E29.001
See application file for complete search history.

(56) References Cited

U.S. PATENT DOCUMENTS

| 6,303,468 | B1 | 10/2001 | Aspar et al. |
| 6,335,258 | B1 | 1/2002 | Aspar et al. |
| 6,756,286 | B1 | 6/2004 | Moriceau et al. |
| 6,809,044 | B1 | 10/2004 | Aspar et al. |
| 6,946,365 | B2 | 9/2005 | Aspar et al. |
| 7,148,538 | B2 | 12/2006 | Forbes |
| RE39,484 | E | 2/2007 | Bruel |
| 7,602,028 | B2 | 10/2009 | Son et al. |
| 7,701,771 | B2 | 4/2010 | Jeong et al. |
| 2004/0016953 | A1 | 1/2004 | Lindsay et al. |
| 2004/0125629 | A1* | 7/2004 | Scheuerlein et al. ........... 365/17 |
| 2006/0099776 | A1 | 5/2006 | Dupont |
| 2008/0014733 | A1* | 1/2008 | Liu ................................ 438/597 |
| 2008/0037349 | A1 | 2/2008 | Stipe |
| 2008/0128780 | A1 | 6/2008 | Nishihara et al. |
| 2008/0237602 | A1 | 10/2008 | Mokhlesi et al. |
| 2008/0239818 | A1 | 10/2008 | Mokhlesi et al. |
| 2008/0242008 | A1 | 10/2008 | Mokhlesi et al. |
| 2008/0248621 | A1 | 10/2008 | Kai et al. |
| 2010/0157644 | A1* | 6/2010 | Norman .......................... 365/51 |
| 2010/0213458 | A1* | 8/2010 | Prall .............................. 257/43 |

FOREIGN PATENT DOCUMENTS

| KR | 10-0806339 B1 | 2/2008 |
| KR | 10-0850508 B1 | 8/2008 |

OTHER PUBLICATIONS

International Search Report from the ISA/KR, International Application No. PCT/US2010/026333, mailed Sep. 17, 2010, three (3) pages.
Written Opinion of the International Searching Authority, ISA/KR, International Application No. PCT/US2010/026333, mailed Sep. 17, 2010, three (3) pages.

(Continued)

Primary Examiner — David S Blum
(74) Attorney, Agent, or Firm — TraskBritt (57) ABSTRACT Methods of forming semiconductor devices that include one or more arrays of memory devices in a three-dimensional arrangement, such as those that include forming a conductive contact in a dielectric material overlying a memory array, wherein a wafer bonding and cleaving process may be utilized to provide a foundation material for forming another memory array having an active region in electrical contact with the conductive contact. Additionally, the conductive contact may be formed in a donor wafer, which in turn may be bonded to a dielectric material overlying a memory array using another wafer bonding process. Novel semiconductor devices and structures including the same may be formed using such methods, for example.

22 Claims, 8 Drawing Sheets

OTHER PUBLICATIONS

Sigen Silicon Genesis, Plasma Activated Bonding for Silicon on Glass (SOG), 5 pages.

Park et al., Design of Depletion Induced Body Screening (DIBS) Structures on SOI for Reliable Nanoscale NAND Flash Array, Inter-University Semiconductor Research Center and School of Electrical Ingineering, Seoul National University, 1 page.

Suni et al, Effects of Plasma Activation on Hydrophilic Bonding of Si and SiO2, Journal of the Electrochemical Society, vol. 149, No. 6, 2002, pp. G348-G351.

Welch, Wafer Bonding: Overview of Science & Technology, Center for Wireless Integrated Microsystems (WIMS) & Solid-State Electronics Laboratory (SSEL), University of Michigan, 69 pages.

* cited by examiner

METHODS FOR FORMING THREE-DIMENSIONAL MEMORY DEVICES, AND RELATED STRUCTURES

TECHNICAL FIELD

Embodiments of the present invention relate generally to methods for forming memory devices and, more specifically, to methods for forming three-dimensional NAND memory devices, and to structures and memory devices that may be formed using such methods.

BACKGROUND

Flash memory devices have developed into a popular source of non-volatile memory for a wide range of electronic applications. Flash memory devices conventionally use a one-transistor memory device that provides high memory densities, high reliability, and low power consumption. NAND is a major form of Flash memory that was designed with a small device size to provide low cost-per-bit data storage and has been primarily used as a high-density storage medium for consumer devices. Common uses for NAND are consumer devices, such as portable audio/video storage devices, personal computers, personal digital assistants (PDAs), digital cameras, and cellular telephones.

A conventional NAND device comprises a memory array including rows and columns of memory cells. Each of the memory cells conventionally includes a field-effect transistor having a control gate and a floating gate. The floating gate is capable of holding a charge and is separated by a thin oxide layer from source, drain, and channel regions contained in a substrate. Each of the memory cells can be electrically programmed (charged) by injecting electrons from the channel region through the oxide layer onto the floating gate. The charge can be removed from the floating gate by tunneling the electrons to the channel region through the oxide layer during an erase operation. Thus, the data in a memory cell is determined by the presence or absence of a charge on the floating gate.

Conventional NAND memory devices include an array of memory cells coupled to form a linear sequence of cells, often referred to as a "string," such that each memory cell is coupled indirectly to a bit line and requires activating the other devices of the string for access. Conventionally, the control gate of each memory cell of a row of the array is connected to a conductive line (e.g., a wordline) having a common voltage, and the drain region of each memory cell of a column of the array is connected to another conductive line (e.g., a bit line) having a common voltage.

As the performance and complexity of electronic systems increase, the requirement for additional memory in memory systems also increases. Moreover, to reduce costs of fabricating such memory arrays, the parts count must be kept to a minimum. This means being able to achieve a higher density of memory on a single chip instead of by stacking separate memory chips. This is often done by reducing the feature size of the memory cell. However, feature sizes of the devices are often limited by device characteristics before a desired, reduced feature size may be reached. In NAND memory arrays in particular, as the channel length and width are reduced and the spacing between memory cells in the arrays are reduced, a minimum feature size may be dictated by the operational characteristics of the memory cells that make up the memory arrays.

BRIEF DESCRIPTION OF THE SEVERAL VIEWS OF THE DRAWINGS

FIGS. 1 through 15 are used to illustrate embodiments of methods that may be used to form semiconductor devices that include one or more stacked memory cell arrays, and to illustrate embodiments of semiconductor devices that include such stacked memory cell arrays.

FIGS. 1 through 4A are partial cross-sectional views of a partially formed semiconductor device during various stages of fabrication;

FIGS. 7 through 9A are partial cross-sectional views of the partially formed semiconductor device during various stages of fabrication;

DETAILED DESCRIPTION

The illustrations presented herein are not meant to be actual views of any particular memory cell, memory array, memory device, or semiconductor device, but are merely idealized representations which are employed to describe the present invention. Additionally, elements common between figures may retain the same numerical designation.

Embodiments of methods of the present invention that may be used to fabricate a three-dimensional memory array (e.g., a three-dimensional NAND array), including multiple memory arrays, are described below with reference to FIGS. 1-15. The memory density on a single chip may be increased by forming additional memory arrays on top of an existing memory array. The term "three-dimensional memory array," as used herein, means and includes an array of devices comprising a plurality of memory devices arranged in levels (e.g., planes) disposed vertically, one above another.

Figure 1:
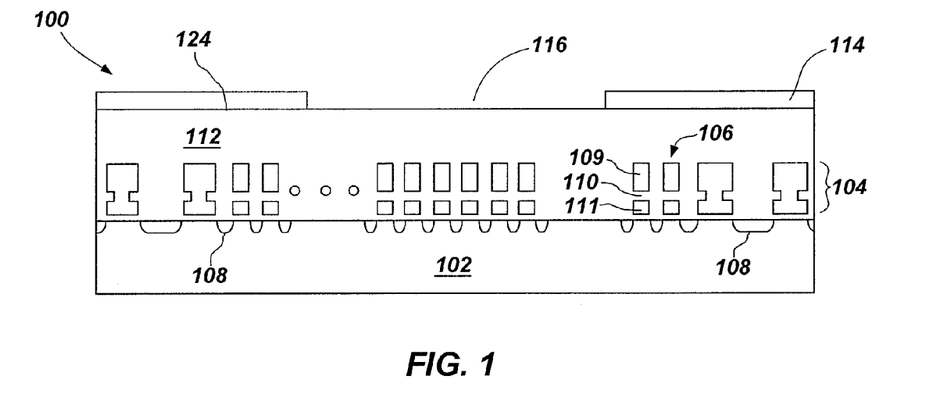

An embodiment of a method that may be used to form a three-dimensional memory array is described with reference to FIGS. 1-9E. FIG. 1 is a partial cross-sectional view of a partially formed semiconductor device 100. The semiconductor device 100 includes wafer 102 having a memory array 104 thereon. As used herein, the term "wafer" means any structure that includes a semiconductor type material including, for example, silicon, germanium, gallium arsenide, indium phosphide, and other III-V or II-VI type semiconductor materials. Wafers include, for example, not only conventional wafers but also other bulk semiconductor substrates such as, by way of non-limiting example, silicon-on-insulator (SOI) type substrates, silicon-on-sapphire (SOS) type substrates, and epitaxial layers of silicon supported by another material. Furthermore, when reference is made to a "wafer" in the following description, previous process steps may have been utilized to at least partially form elements or components of a circuit or device in or over a surface of the wafer.

Various two-dimensional memory arrays, as well as methods for forming such memory arrays and using such memory arrays are known in the art. As used herein, the term "two-dimensional memory array" means and includes an array of devices arranged so as to form a plurality of memory devices arranged in a single level with respect to a material, such as a wafer. Embodiments of the present invention comprise stacked, or superimposed, two-dimensional memory arrays, together forming a three-dimensional memory array. By way of non-limiting example, the memory array 104 may be a two-dimensional structure such as a NAND memory array, which may include a plurality of electrically re-writable and non-volatile memory devices 106, such as transistors, arranged on a surface of the wafer 102. Each of the plurality of memory devices 106 may include any configuration of type of memory device known in the art. For example, each of the memory devices 106 may include a field-effect transistor having a control gate 109 and a floating gate 111 separated by one or more intervening dielectric layers 110. The floating gate 111 is capable of holding a charge and is separated by a thin oxide layer from source, drain, and channel regions contained in a substrate. The wafer 102 may include a doped p-type silicon (Si) having doped n-type source and drain regions 108 therein. Alternatively, the wafer 102 may include doped n-type silicon while the source and drain regions 108 include doped p-type silicon.

With continued reference to FIG. 1, a dielectric material 112 may be formed over the semiconductor device 100 (e.g., over exposed regions of the wafer 102 and at least partially surrounding the memory devices 106 of the memory array 104). The dielectric material 112 may include, for example, doped or undoped silicon dioxide ($SiO_2$) or silicon nitride ($Si_3N_4$). The dielectric material 112 may be formed over the semiconductor device 100 using conventional deposition techniques (e.g., chemical vapor deposition (CVD), physical vapor deposition (PVD)), which are not described in detail herein. The dielectric material 112 be formed having a thickness at least covering the memory array 104.

A mask 114 may be provided over a major surface 124 of the dielectric material 112. The mask 114 includes an aperture 116 that extending through the mask 114 at a selected location over the semiconductor device 100 at which it is desired to form a conductive layer that will be used to form a contact to the body of a semiconductor device, as will be described in further detail below. The mask 114 may be formed, for example, by depositing a photoresist material over the exposed major surface 124 of the dielectric material 112 and selectively patterning (e.g., masking, exposing and developing) the layer of photoresist material to form the aperture 116 at a selected location, as known in the art. After forming the aperture 116, a portion of the dielectric material 112 may be removed by exposing the dielectric material 112 to an etchant through the aperture 116 in the mask 114. For example, a dry (i.e., plasma) etching process may be used to remove the dielectric material 112 selective to the aperture 116 in the mask 114. The processing parameters for such a dry etching process will depend upon the compositions of the dielectric material 112 and the mask 114, and various anisotropic plasma etching processes are known in the art for many dielectric materials. After removing the portion of the dielectric material 112, the mask 114 may be removed from the semiconductor device 100.

Figure 2:
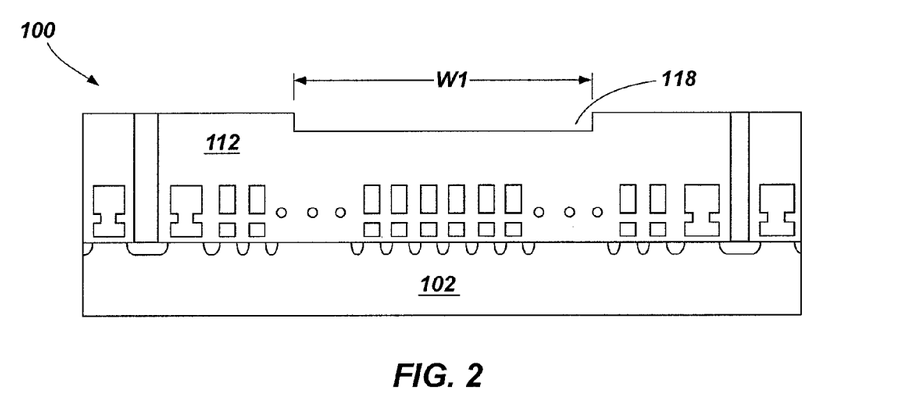

As shown in FIG. 2, removal of the dielectric material 112 may form an opening 118 therein. The opening 118 may be formed to extend transversely through the major surface of the dielectric material 112, to a substantially uniform depth having a bottom surface parallel to the major surface of the wafer 102. By way of non-limiting example, the dielectric material 112 may be removed to form an opening 118 having an average depth D1 of between about five nanometers (5 nm) and about four hundred nanometers (400 nm). More particularly, the average depth D1 of the opening 118 may be, for example, between about fifty nanometers (50 nm) and about two hundred fifty nanometers (250 nm). As a non-limiting example, the opening 118 may be formed to have an average width W1 of between about one-half micrometer (0.5 μm) and about ten micrometers (10 μm). FIG. 2 is shown having a single opening 118 for the sake of simplicity, however, in some embodiments, a plurality of openings 118 may be formed in the dielectric material 112.

Figure 3:
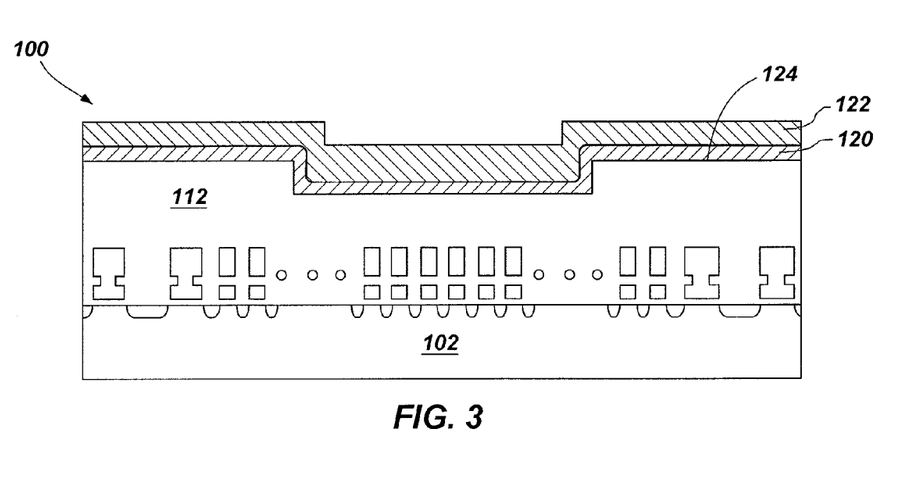

Referring to FIG. 3, after forming the opening 118 in the dielectric material 112, a relatively thin barrier material 120 may, optionally, be formed over the semiconductor device 100 such that the barrier material 120 at least lines the surfaces of the semiconductor device 100 within the opening 118. As used herein, the term "barrier material" means and includes any material that serves as a barrier to protect another material from one or more reagents, although barrier materials may also serve other additional purposes. By way of non-limiting example, the barrier material 120 may be formed over the exposed major surface 124 of the dielectric material 112 and the exposed surfaces within the opening 118. The barrier material 120 may serve as a barrier to protect regions of the dielectric material 112 exposed within the opening 118 from deposition processes used to form a conductive contact, which will be described in further detail below. For example, the barrier material 120 may serve as a barrier to protect exposed regions of the dielectric material 112 from a precursor used to deposit a conductive material, as described in further detail below. By way of example and not limitation, the barrier material 120 may comprise a metal silicide such as, for example, titanium silicide ($TiSi_2$), a metal nitride, or a nitrogen-doped metal silicide. The optional barrier material 120 may be deposited on or formed over the dielectric material 112 having a thickness of less than about fifty nanometers (50 nm).

A conductive material 122 may then be provided over the major surface 124 of the dielectric material 112 or, if present, the barrier material 120, such that the conductive material 122 fills the opening 118 or a remaining portion thereof. As a non-limiting example, the conductive material 122 may comprise conductive tungsten nitride (TiN). In other embodiments, the conductive material 122 may comprise a conductive metal material (e.g., tungsten) or a conductive polysilicon material (e.g., doped polysilicon).

After filling the opening 118, portions of the conductive material 122 and the barrier material 120, if present, overlying the major surface 124 of the dielectric material 112 outside the opening 118 may be removed. For example, a planarization process may be used to remove the conductive material 122 and, if present, the barrier material 120, on and over the major surface 124 of the dielectric material 112 outside the opening 118. Optionally, a portion of the dielectric material 112 outside of the opening 118 may be removed with the conductive material 122 and the barrier material 120, if present. Such a planarization process may include a chemical planarization process, a mechanical planarization process, or a chemical-mechanical planarization (CMP) process. By way of non-limiting example, a chemical-mechanical planarization (CMP) process may be used that will remove the conductive material 122, the barrier material 120, if present, and the dielectric material 112 to render an upper surface of the semiconductor device 100 substantially planar.

Figure 4A:
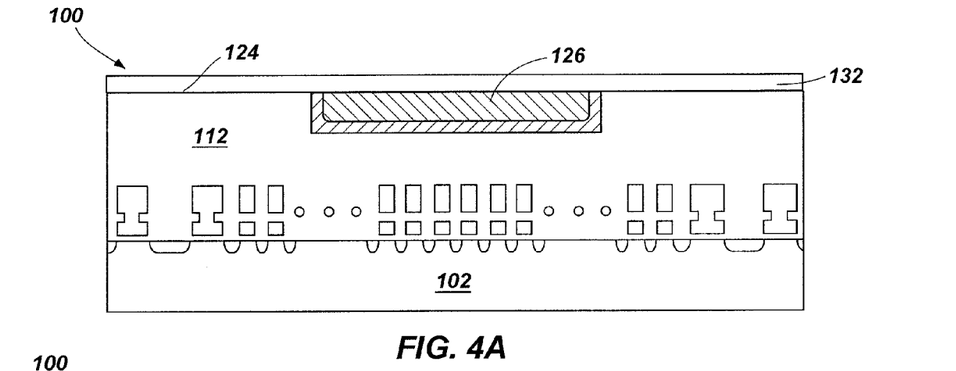

Referring to FIG. 4A, removal of the conductive material 122 and, if present, the barrier material 120, from the major surface 124 of the dielectric material 112 may result in formation of a conductive contact 126. As a non-limiting example, the conductive contact 126 may comprise a conductive polysilicon material and may have an average thickness of less than about four hundred nanometers (400 nm) and, more particularly, between about fifty nanometers (50 nm) and about two hundred fifty nanometers (250 nm). In other embodiments, the conductive contact 126 may comprise tungsten nitride or tungsten overlying a titanium silicide material, which may line surfaces of the conductive contact 126 in contact with the dielectric material 112, and may have an average thickness of less than about five hundred nanometers (500 nm), and more particularly, between about five nanometers (5 nm) and about thirty nanometers (30 nm).

A bonding material 132 may, optionally, be formed over the semiconductor device 100. The bonding material 132 may comprise any material that facilitates bonding of the semiconductor device 100 with another wafer such as, for example, a polysilicon material. The bonding material 132 may, optionally, be formed using a process such as, for example, a chemical vapor deposition (CVD) process and, thereafter, may be polished back using a chemical-mechanical planarization (CMP) process. Thus, the bonding material 132 may provide a substantially planar surface including a single material that facilitates bonding, as will be described below.

Figure 4B:
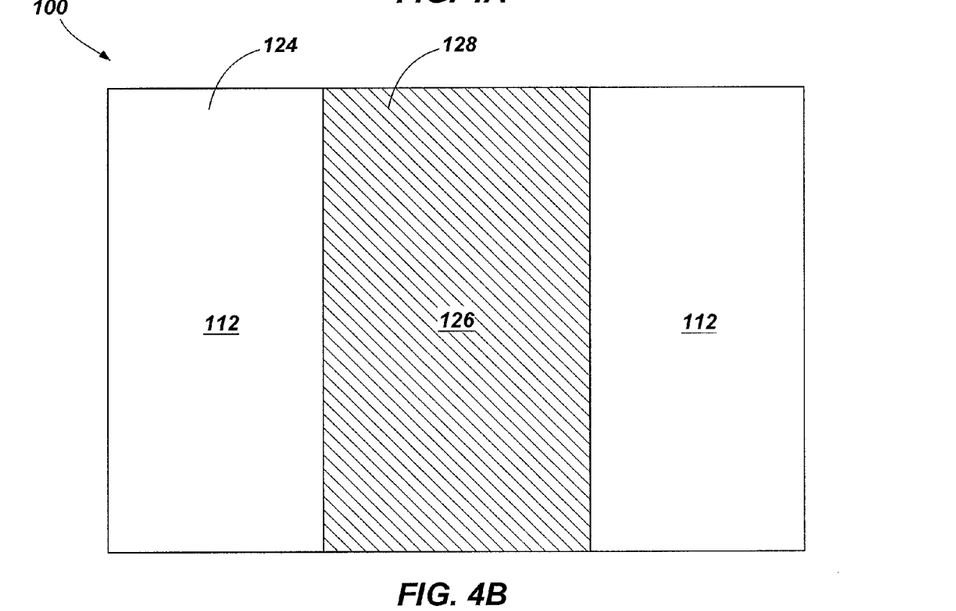
FIG. 4B is a partial plan view of a surface of the partially formed semiconductor device shown in FIG. 4A (the top surface of the device from the perspective of FIG. 4A)

FIG. 4B is a partial plan view of a major surface of the partially formed semiconductor device 100 shown in FIG. 4A (the top surface of the semiconductor device 100 from the perspective of FIG. 4A) before forming the optional bonding material 132 thereon. FIG. 4B illustrates the exposed major surface 124 of the dielectric material 112 and an exposed upper surface 128 of the conductive contact 126 formed on the semiconductor device 100. As shown in FIGS. 4A and 4B, at this stage of the fabrication process, a major longitudinal portion of the conductive contact 126 may extend through the dielectric material 112, in a direction substantially parallel to the generally planar wafer 102.

Figure 5:
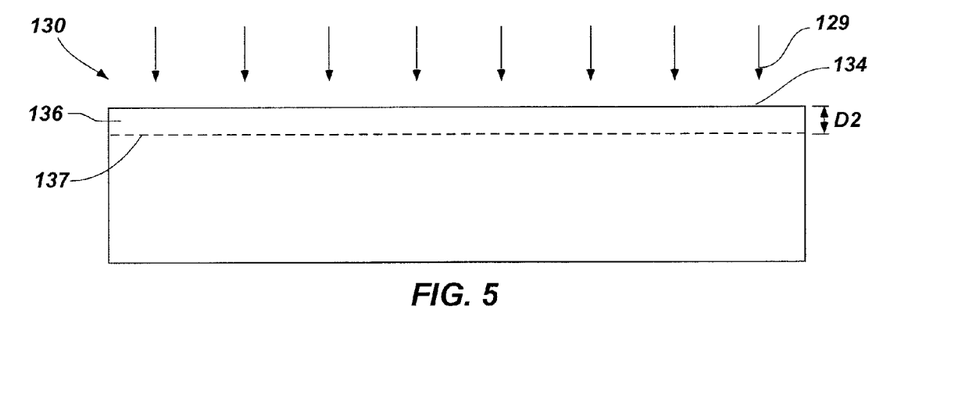
FIGS. 5 and 6 are partial cross-sectional views of a donor wafer that may be used to form a foundation material over the partially formed semiconductor device shown in FIGS. 1 through 4B.
Figure 8:
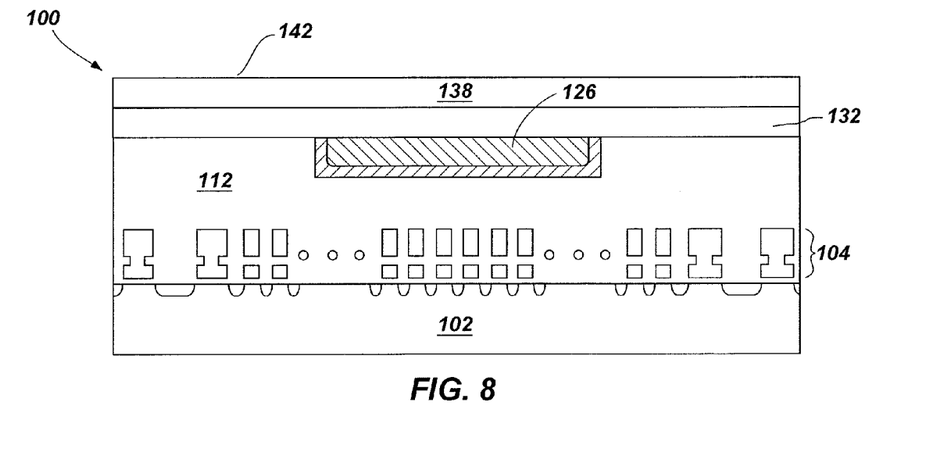

Referring to FIG. 5, a donor wafer 130 is depicted that will later be used to dispose a foundation material 138 over the dielectric material 112 of the semiconductor structure 100 as shown in FIG. 8. As a non-limiting example, the foundation material 138 may be placed by a process described herein using a modification of so-called SMART-CUT® technology. Such processes are described in detail in, for example, U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to Dupont. However, other processes suitable for manufacturing a semiconductor material on the surface of a logic device may also be used, if sufficiently low process temperatures are maintained. In a conventional implementation of SMART-CUT® technology, donor and acceptor wafers are bonded together using a high temperature anneal, on the order of about 1000° C. to about 1300° C. However, an additional plasma activation act may be integrated into a conventional SMART-CUT® technology fabrication process to lower a required bonding temperature, as described in detail below.

The donor wafer 130 may comprise any structure that includes a semiconductor type material including, for example, silicon, germanium, gallium arsenide, indium phosphide, and other III-V or II-VI type semiconductor materials. By way of non-limiting example, the donor wafer 130 may include a silicon material. A plurality of ions (e.g., hydrogen or inert gas ions) may be implanted into the donor wafer 130 to form an implanted region 136. As represented by directional arrows 129, an ion source (not shown) may be used to implant the plurality of ions into the donor wafer 130 in a direction substantially perpendicular to a major surface 134 of the donor wafer 130 to create the implanted region 136, which may also be characterized as a transfer region, the inner boundary 137 of which is shown in the donor wafer 130 in broken lines. As known in the art, the depth at which the ions are implanted into the donor wafer 130 is at least partially a function of the energy with which the ions are implanted into the donor wafer 130. Generally, ions implanted with less energy will be implanted at relatively shallower depths, while ions implanted with higher energy will be implanted at relatively deeper depths. The inner boundary 137 of implanted region 136 lies substantially parallel to the major surface 134 of the donor wafer 130 and is at a predetermined depth, which is dependent on selected parameters of the atomic species implant process, as is well known to one of ordinary skill in the art. As a non-limiting example, ions may be implanted into the donor wafer 130 with an energy selected to form the inner boundary 137 at depth D2 of between about eighty nanometers (80 nm) and about five hundred nanometers (500 nm) (about 800 Å to about 5000 Å), and more particularly, about two hundred nanometers (200 nm) within the donor wafer 130.

The inner boundary 137 comprises a layer of microbubbles or microcavities (not shown) comprising the implanted ion species, and provides a weakened structure within donor wafer 130. The donor wafer 130 may then be thermally treated at a temperature above that at which implantation is effected, in accordance with the disclosures of the patent documents in the preceding paragraph, to effect crystalline rearrangement in the donor wafer 130 and coalescence of the microbubbles or microcavities.

Figure 6:
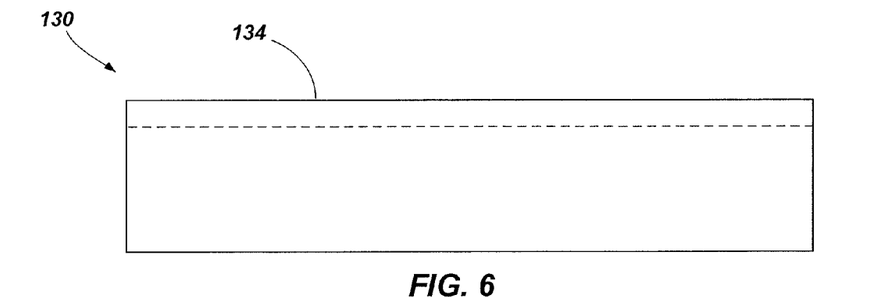

An attachment surface (not shown) may be formed by exposing the major surface 134 of the donor wafer 130 or the bonding material 132, if present, to a reactive ion etching (RIE) plasma including an inert gas (e.g., argon, oxygen, or nitrogen) to form a plasma-activated material. The plasma-activated material increases the kinetics of a subsequent bonding act in the form of an oxide reaction with adjacent material of the dielectric material 112 overlying the memory array 104, due to the increased mobility of the ionic species (e.g., hydrogen) created on a major surface 134 thereof. By utilizing a plasma-activated material, the wafer bonding process may be performed at temperatures of less than about four hundred degrees Celsius (400° C.). One embodiment of plasma-activated bonding is described in U.S. Pat. No. 6,180,496 to Farrens et al., assigned to Silicon Genesis Corporation.

Figure 7:
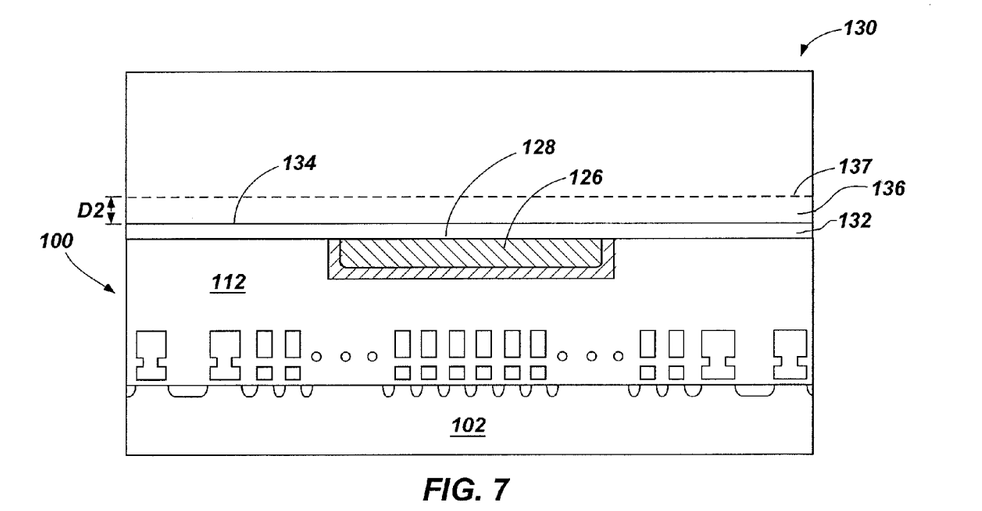

As shown in FIG. 7, the donor wafer 130 is disposed on the major surface 124 of the dielectric material 112 and the upper surface 128 of the conductive contact 126, or the bonding material 132, if present, and may be bonded to the dielectric material 112 using an annealing process as described above with respect to FIG. 4A. The hydrogen or other ions implanted in ion implanted region 136 to the depth of inner boundary 137 makes the silicon in the thermally treated donor wafer 130 susceptible to breakage along inner boundary 137 when a shear force is applied substantially parallel to the major surface of the donor wafer 130. After attaching the donor wafer 130 to the semiconductor device 100, the portion of the donor wafer 130 on the side of the inner boundary 137 opposing the major surface of the dielectric material 112, or a major surface of the bonding material 132, if present, may be cleaved or fractured by applying a shearing force to the donor wafer 130. The portion of the donor wafer 130 below the inner boundary 137, of a thickness, for example, of between about five nanometers (5 nm) and about four hundred nanometers (400 nm), is detached from the donor wafer 130 and remains bonded to the semiconductor structure 100 to form a foundation material 138, as shown in FIG. 8.

Referring still to FIG. 8, after the foundation material 138 is separated from the donor wafer 130 and bonded over the dielectric material 112 and the conductive contact 126 or the bonding material 132, if present, an exposed surface 142 thereof may be undesirably rough. To remedy this deficiency, the exposed surface 142 of the foundation material 138 may be smoothed to a desired degree in order to facilitate further processing as described below, according to techniques known in the art such as, for example, one or more of grinding, wet etching, and chemical-mechanical polishing (CMP).

Figure 9A:
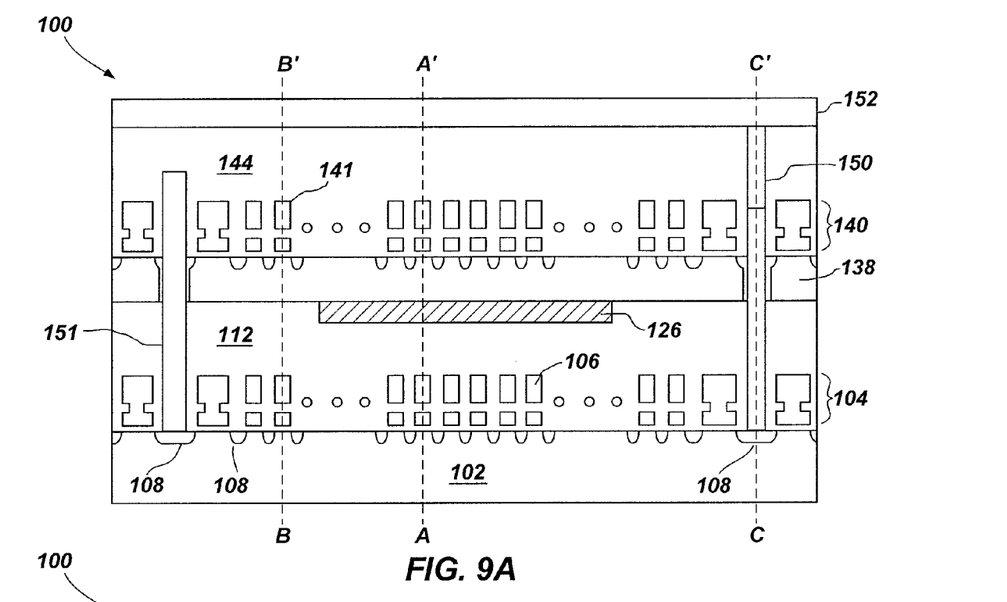

As shown in FIG. 9A, the foundation material 138 may be used as a substrate on which to form another memory array 140 that includes a plurality of memory devices 141 and that is similar to or identical to the memory array 104 in accordance with processes known in the art. The memory arrays 104 and 140 may be separated by the dielectric material 112 and at least a portion of the memory devices 141 in the another memory array 140 may be aligned with the underlying conductive contact 126. In this way, the methods described herein may be used to form a three-dimensional memory array including at least two complete memory arrays (e.g., NAND memory arrays), each arranged in a single level (e.g., a two-dimensional memory array), and stacked vertically above one another. The conductive contact 126 may contact an underside of an active region of at least one of the memory devices providing an electrical connection to the active region of the memory devices 141 within the memory array 140. Optionally, conductive lines 150, 151 may be formed, each of which extends through certain source and drain regions 108 of the memory array 104 forming a common source contact for the different memory arrays as well as common bit line contact for the different memory arrays. For example, the conductive lines 150, 151 may be formed from polysilicon or a metal such as, copper (Cu), silver (Ag), gold (Au), tungsten (W), aluminum (Al), or combinations thereof. The conductive line 150 may be electrically coupled to a bit line 152 overlying a top surface of the completed stack of memory arrays of the semiconductor device 100. The conductive lines 150, 151 may be formed by removing a portion of each of the foundation material 138 and the foundation material 148, and the dielectric material 112 and the dielectric material 144, to form a via therethrough and, thereafter, filling the via with a metal material. For example, if the foundation material 138 includes silicon and the dielectric material 112, 144 includes silicon dioxide, an anisotropic reactive ion (i.e., plasma) etching process may be used to form the via. After forming the via, a metal material may be deposited to fill the via using, for example, a chemical vapor deposition (CVD) process, a physical vapor deposition (PVD) process, or an atomic layer deposition (ALD) process.

Figure 9B:
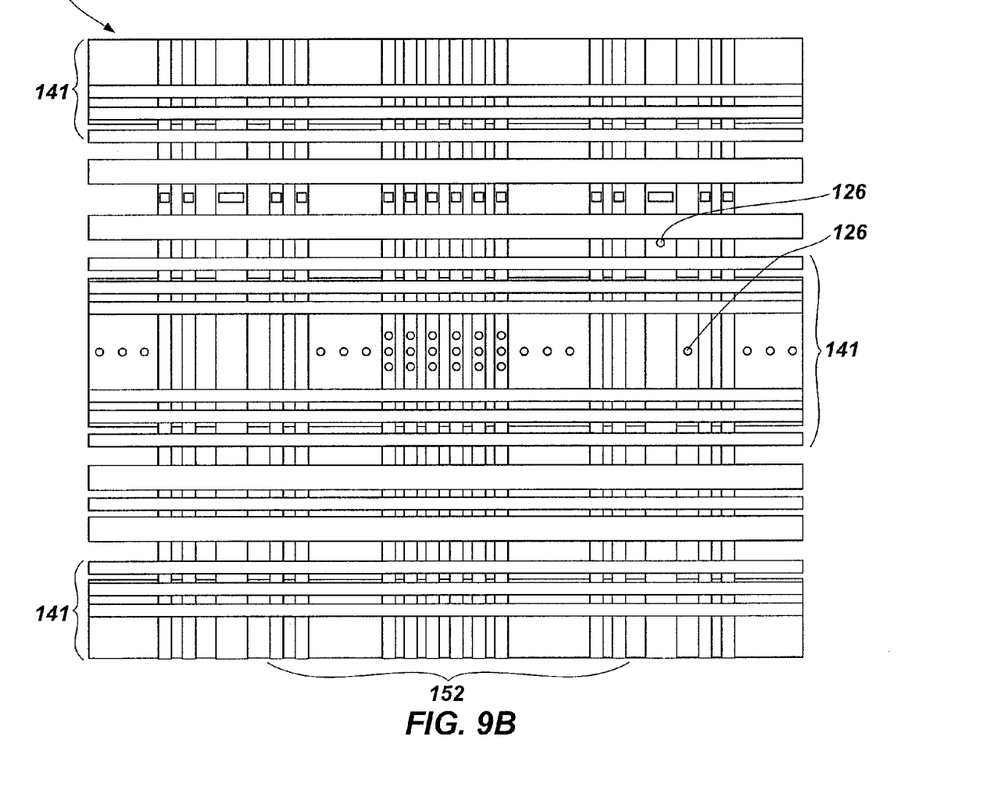
FIG. 9B is a partial plan view of a surface of the partially formed semiconductor device shown in FIG. 9A (the top surface of the device from the perspective of FIG. 9A)

FIG. 9B is a partial plan view of a major surface of the partially formed semiconductor device 100 shown in FIG. 9A (the top surface of the semiconductor device 100 from the perspective of FIG. 9A). FIG. 9B shows an example layout wherein the memory array 141 is arranged in rows and overlying bit lines 152 perpendicular to the rows of the memory array 141. Conductive contacts 126 are buried within the semiconductor device 100 and are in electrical contact with an active region of at least one of the memory devices of the memory array 141.

Figure 9C:
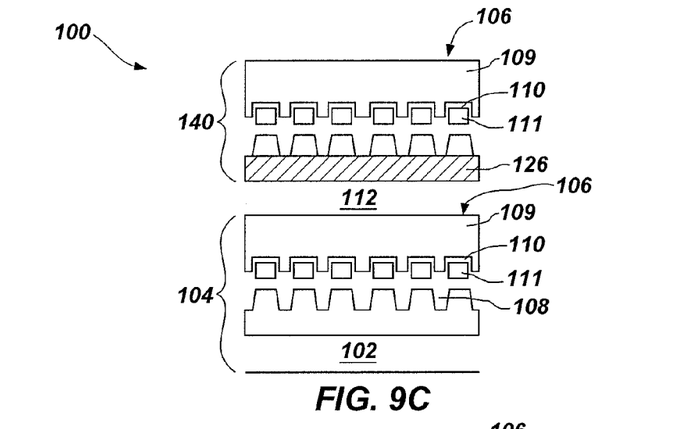
FIG. 9C is a partial cross-sectional view of the semiconductor device shown in FIG. 9A taken along section line A'-A therein.

Finally, FIG. 9C is a cross-sectional view of the semiconductor device 100 shown in FIG. 9A taken along section line A'-A shown therein. The semiconductor device 100 includes memory arrays 140/104, a conductive contact 126 and dielectric material 112. The memory arrays 104/140 each include a plurality of memory devices 106 comprising control gate 109, floating gate 111 and dielectric layer 110. The conductive contact 126 forms an electrical connection to active regions of the memory devices 106 of the memory array 140. By providing electrical contact to the active regions of the memory devices 106, the conductive contact 126 enables an electrical connection to be formed between multiple active layers using a single contact.

Figure 9D:
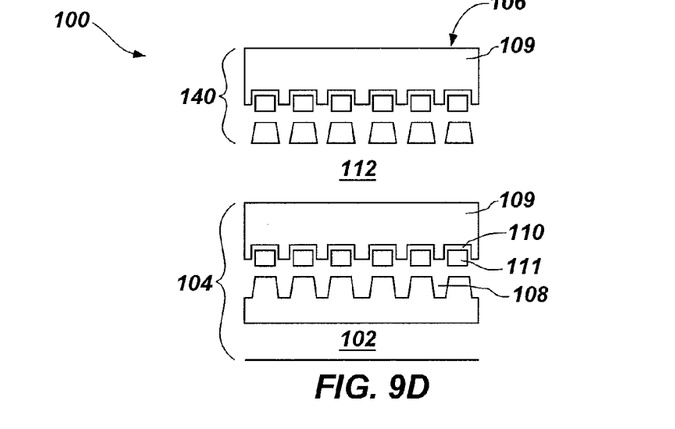
FIG. 9D is a partial cross-sectional view of the semiconductor device shown in FIG. 9A taken along section line B'-B therein.

FIG. 9D is a cross-sectional view of the semiconductor device 100 shown in FIG. 9A taken along section line B'-B shown therein. The semiconductor device 100 includes memory arrays 140/104 and dielectric material 112. Therefore, the memory devices 106 of the memory array 140 are isolated and, thus, may be electrically contacted using a single dedicated contact structure (not shown).

Figure 9E:
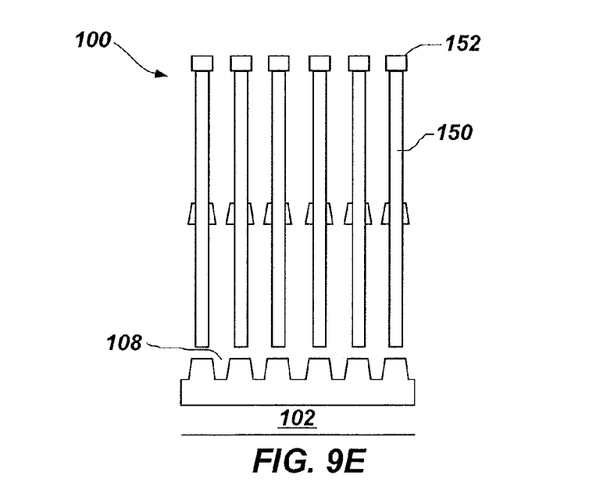
FIG. 9E is a partial cross-sectional view of the semiconductor device shown in FIG. 9A taken along section line C'-C therein.

FIG. 9E is a cross-sectional view of the semiconductor device 100 shown in FIG. 9A taken along section line C'-C shown therein.

Using methods such as those described with respect to FIGS. 1-9E, one or more additional levels of memory arrays (not shown), and an active region of at least one memory device of which is electrically connected by an underlying conductive structure, may be formed.

Another embodiment of a method that may be used to form a three-dimensional memory array such as, for example, a NAND memory array, is described with reference to FIGS. 10-15.

Figure 10:
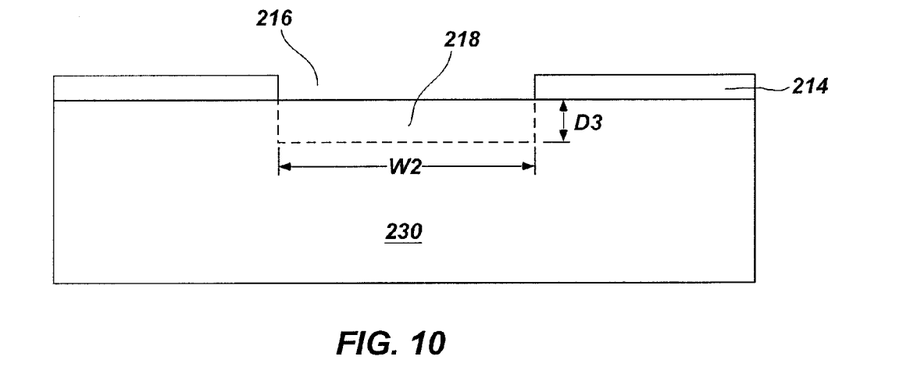
FIGS. 10 through 15 are partial cross-sectional views of a partially formed semiconductor device during various stages of fabrication.
Figure 11:
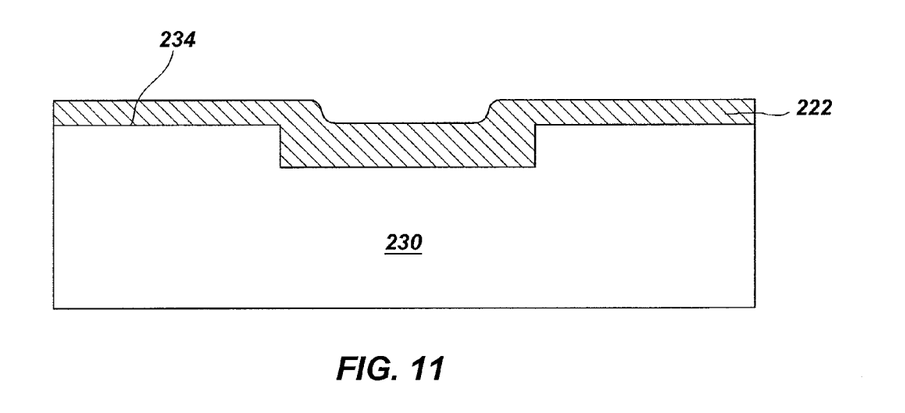

Referring to FIG. 10, a mask 214 may be provided over a major surface of a donor wafer 230. The mask 214 may include an aperture 216 that extends therethrough at selected locations over the donor wafer 230 at which it is desired to form a conductive contact, as will be described in further detail below. The donor wafer 230 may comprise any structure that includes a semiconductor type material, such as, for example, a silicon wafer. The mask 214 having the aperture 216 therethough may be formed using methods previously described in relation to FIG. 1. After forming mask 214, an opening 218, represented in broken lines, may be formed by removing a portion of the donor wafer 230 through the aperture 216 in the mask 214. The portion of the donor wafer 230 may be removed, for example, by exposing the donor wafer 230 to an etchant through the aperture 216 in the mask 214. As a non-limiting example, a dry (i.e., plasma) etching process may be used to remove the portion of the donor wafer 230 selective to the mask 214. A portion of the donor wafer 230 may be removed to form an opening 218 having an average depth D3 of between about five nanometers (5 nm) and about four hundred nanometers (400 nm). More particularly, the average depth D3 of the opening 218 may be, for example, between about fifty nanometers (50 nm) and about two hundred fifty nanometers (250 nm). As a non-limiting example, the opening 218 may be formed to have an average width W2 of between about three microns (3 μm) and about ten microns (10 μm).

After forming the opening 218 in the donor wafer 230, a conductive material 222 (see FIG. 11) and, optionally, a barrier material (not shown) may be formed over the donor wafer 230 filling the opening 218 using methods previously described with respect to FIG. 3. The conductive material 222 and, if present, the barrier material, may then be removed from a major surface 234 of the donor wafer 230 outside the opening 218 using, for example, a planarization process. By way of non-limiting example, a chemical-mechanical planarization (CMP) process may be used which removes the conductive material 222, the barrier material, if present, at substantially the same rate as the donor wafer 230.

Figure 12:
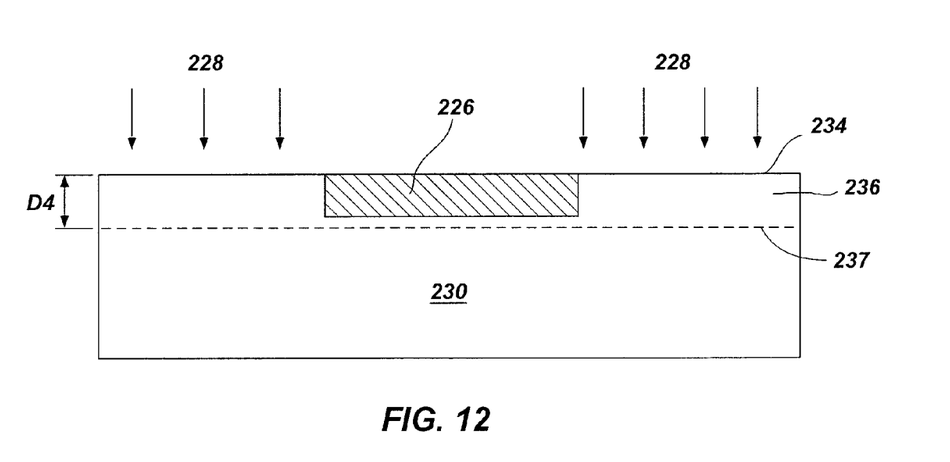

Referring to FIG. 12, a conductive contact 226 may be formed by removing the conductive material 222 and, if present, the barrier material, from the major surface 234 of the donor wafer 230. Thereafter, an implanted region 236, and an inner boundary 237 of which is represented by broken lines, may optionally be formed using an ion implantation process such as that described with respect to FIG. 5. For example, the implanted region 236 may be formed using an ion implantation process wherein a plurality of ions (e.g., hydrogen or inert gas ions), represented in FIG. 12 by directional arrows 228, may be implanted into a portion of the donor wafer 230. The ions may be implanted into the donor wafer 230 using an energy selected to implant the ions at a depth D4 underlying the conductive contact 226, or between about eighty nanometers (80 nm) and about five hundred nanometers (500 nm) (i.e., about 800 Å to about 5000 Å), and more particularly, about two hundred nanometers (200 nm) within the donor wafer 230.

Figure 13:
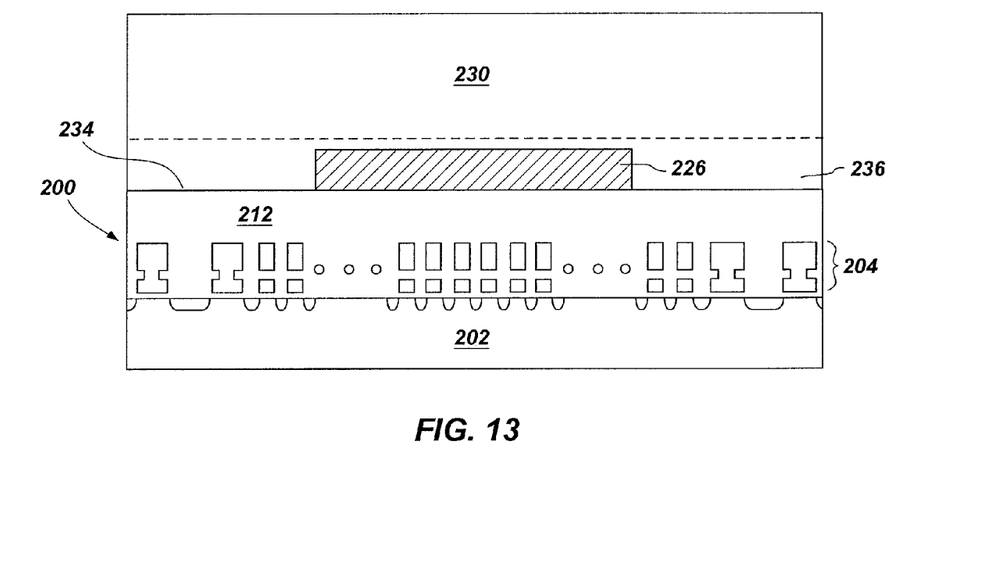
Figure 14:
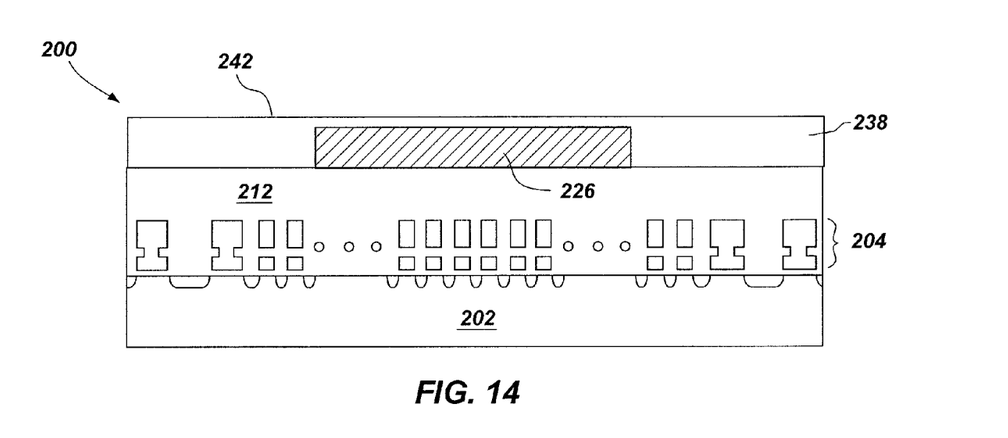

Referring to FIG. 13, the donor wafer 230 having the conductive contact 226, and the implanted region 236 therein, may be disposed on and bonded to a partially formed semiconductor device 200 including dielectric material 212 overlying a memory array 204 on a wafer 202. The semiconductor device 200 may be identical or similar to the semiconductor device 100 described with respect to FIG. 1. The donor wafer 230 may be bonded to the semiconductor device 200 using methods similar or identical to those described with respect to FIGS. 5 through 7. After attaching (i.e., bonding) the donor wafer 230 to the semiconductor device 200, a portion of the donor wafer 230 may be cleaved or fractured by applying a shearing force thereto to form a foundation material 238 (as described with respect to FIG. 8), as shown in FIG. 14. The foundation material 238 may have a thickness, for example, of about five nanometers (5 nm) and about four hundred nanometers (400 nm). Optionally, the conductive contact 226 may be formed in the donor wafer 230 prior to or in parallel with fabrication of the memory array 204 on the wafer 202. By processing the conductive contact 226 in the donor wafer 230 at substantially the same time as fabricating the memory array 204 on the wafer 202, a memory device (NAND memory device) may be formed at a reduced cost. An exposed surface 242 of the foundation material 238, which may be undesirably uneven or rough, may be smoothed to a desired degree in order to facilitate further processing as described below, according to techniques known in the art such as, for example, one or more of grinding, wet etching, and chemical-mechanical polishing (CMP).

Figure 15:
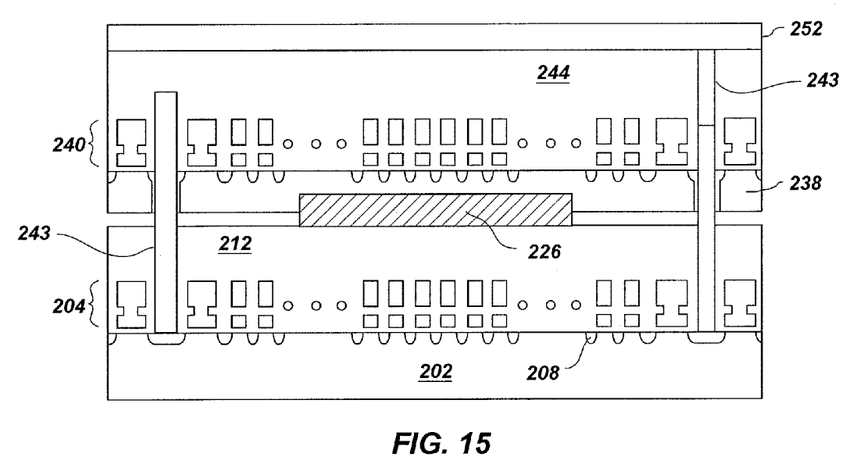

Referring to FIG. 15, another complete memory array 240 may be formed over the foundation material 238, as described with respect to FIG. 9A and, optionally, another dielectric material 244 and a bit line 252 may be formed over the another memory array 240. Conductive lines 243 may be formed that extend through a respective one of the source and drain regions 208 of the another memory array 240 to a respective one of the source and drain regions 208 of the memory array 204, as described with respect to FIGS. 9A and 9B. At least one of the conductive lines 243 may contact the bit line 252 such that, as a current is passed through the bit line 252, an electrical connection is established between the conductive contact 226 and the bit line 252.

While the invention may be susceptible to various modifications and alternative forms, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A method of forming a semiconductor device, comprising:
    forming at least one memory array comprising a plurality of memory devices over another memory array comprising another plurality of memory devices such that a conductive material formed between a foundational material for the at least one memory array and a dielectric material overlying the another memory array electrically contacts an active region of at least one of the plurality of memory devices.

2. The method of claim 1, wherein forming at least one memory array over another memory array comprises:
    forming the another memory array;
    forming the dielectric material over the another memory array;
    forming the conductive material over at least a portion of the dielectric material;
    forming the foundational material over at least the conductive material; and
    forming the at least one memory array over the foundational material.

3. The method of claim 1, wherein forming at least one memory array over another memory array comprises forming a NAND array over another NAND array.

4. The method of claim 2, wherein forming the conductive material over at least a portion of the dielectric material comprises:
    removing at least a portion of the dielectric material to form at least one opening extending partially through the at least a portion of the dielectric material; and
    depositing the conductive material within the at least one opening.

5. The method of claim 4, wherein forming the foundational material over at least the conductive material comprises forming the foundation material over each of the conductive material and the dielectric material.

6. The method of claim 5, wherein forming the at least one memory array over a foundation material comprising a semiconductor material comprises forming the at least one memory array on a foundation material having a conductive contact therein.

7. The method of claim 5, wherein forming the foundation material over each of the conductive material and the dielectric material comprises extending the foundational material over each of the conductive material and the dielectric material in a direction substantially perpendicular to that of the conductive material.

8. A method of forming a semiconductor device, comprising:
    forming a dielectric material over a plurality of memory devices disposed on a wafer, the dielectric material at least partially surrounding the plurality of memory devices;

removing at least a portion of the dielectric material to form at least one opening therein extending through a major surface of the dielectric material;

forming a conductive material within the at least one opening in the dielectric material;

attaching another wafer to the major surface of the dielectric material; and separating a portion of the another wafer to leave a foundation material overlying the major surface of the dielectric material and a surface of the conductive material.

9. The method of claim 8, wherein forming a dielectric material over a plurality of memory devices disposed on a wafer comprises forming the dielectric material over at least one NAND array.

10. The method of claim 8, wherein forming a dielectric material over a plurality of memory devices disposed on a wafer comprises forming a silicon dioxide material over the plurality of memory devices.

11. The method of claim 8, wherein removing at least a portion of the dielectric material to form at least one opening therein comprises forming the at least one opening within the dielectric material having an average depth of between about five nanometers (5 nm) and about four hundred nanometers (400 nm).

12. The method of claim 8, wherein removing at least a portion of the dielectric material to form at least one opening therein comprises forming the at least one opening within the dielectric material having an average width of between about one-half micron (0.5 μm) and about ten microns (10 μm).

13. The method of claim 8, wherein forming a conductive material within the at least one opening in the dielectric material comprises forming a conductive material comprising at least one of polysilicon and a metal.

14. The method of claim 8, wherein forming a conductive material within the at least one opening in the dielectric material comprises forming a conductive material comprising tungsten nitride.

15. The method of claim 8, wherein forming a conductive material within the at least one opening in the dielectric material comprises:

forming a conductive material over the major surface of the dielectric material to fill the at least one opening; and removing portions of the conductive material outside the at least one opening to render the major surface of the dielectric material substantially planar with the surface of the conductive material.

16. The method of claim 8, further comprising implanting ions into the another wafer to form an implanted region therein.

17. The method of claim 16, wherein attaching the another wafer to the major surface of the dielectric material comprises bonding the another wafer having an implanted region therein, the implanted region having a depth of between about eighty nanometers (80 nm) and about five hundred nanometers (500 nm).

18. The method of claim 8, wherein separating a portion of the another wafer to leave a foundation material overlying the major surface of the dielectric material and a surface of the conductive material comprises separating the portion of the another wafer along an inner boundary of an implanted region therein.

19. The method of claim 8, further comprising forming another plurality of memory devices on the foundation material, each of the memory devices of the another plurality on the foundation material overlying the plurality of memory devices disposed on the wafer.

20. The method of claim 19, wherein forming another plurality of memory devices on the foundation material comprises forming an active region of the another plurality of memory devices in electrical contact with the conductive material.

21. The method of claim 19, further comprising forming a conductive line extending from a bit line overlying the another plurality of memory devices and in electrical contact with a drain region of the another plurality of memory devices and a drain region of the plurality of memory devices.

22. The method of claim 19, further comprising:

repeating forming, removing, attaching, and separating to form another foundation material overlying another dielectric material having another conductive material therein; and forming a third plurality of memory devices on the another foundation material.

\* \* \* \* \*